United States Patent
Gandikota et al.

(10) Patent No.: US 11,705,335 B2
(45) Date of Patent: Jul. 18, 2023

(54) CONFORMAL HIGH CONCENTRATION BORON DOPING OF SEMICONDUCTORS

(71) Applicant: Applied Materials, Inc., Santa Clara, CA (US)

(72) Inventors: Srinivas Gandikota, Santa Clara, CA (US); Abhijit Basu Mallick, Sunnyvale, CA (US); Swaminathan Srinivasan, Pleasanton, CA (US); Rui Cheng, Santa Clara, CA (US); Susmit Singha Roy, Campbell, CA (US); Gaurav Thareja, Santa Clara, CA (US); Mukund Srinivasan, Fremont, CA (US); Sanjay Natarajan, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/724,994

(22) Filed: Apr. 20, 2022

(65) Prior Publication Data
US 2022/0246432 A1    Aug. 4, 2022

Related U.S. Application Data

(62) Division of application No. 16/444,856, filed on Jun. 18, 2019, now Pat. No. 11,328,928.

(60) Provisional application No. 62/686,623, filed on Jun. 18, 2018.

(51) Int. Cl.
*H01L 21/225* (2006.01)
*H01L 21/30* (2006.01)
*H01L 21/02* (2006.01)
*H01L 21/67* (2006.01)

(52) U.S. Cl.
CPC .... *H01L 21/2257* (2013.01); *H01L 21/02043* (2013.01); *H01L 21/02164* (2013.01); *H01L 21/30* (2013.01); *H01L 21/67167* (2013.01)

(58) Field of Classification Search
CPC combination set(s) only.
See application file for complete search history.

(56) References Cited

U.S. PATENT DOCUMENTS

| | | | |
|---|---|---|---|
| 3,751,314 A * | 8/1973 | Rankel | H01L 21/31625 438/563 |
| 5,279,976 A * | 1/1994 | Hayden | H01L 21/2256 257/E21.15 |
| 2009/0269913 A1* | 10/2009 | Terry | H01L 21/02532 438/558 |
| 2012/0034761 A1* | 2/2012 | Kuppurao | H01L 21/02046 257/E21.317 |
| 2012/0187539 A1* | 7/2012 | De Souza | H01L 31/1804 257/607 |
| 2013/0115763 A1 | 5/2013 | Fakamure et al. | |
| 2013/0130485 A1* | 5/2013 | Lin | H01L 21/2257 438/581 |
| 2015/0079773 A1 | 3/2015 | Basker et al. | |
| 2015/0279974 A1 | 10/2015 | Godet et al. | |
| 2016/0056156 A1 | 2/2016 | Ghani et al. | |

(Continued)

Primary Examiner — Victor A Mandala
Assistant Examiner — Lawrence C Tynes, Jr.
(74) Attorney, Agent, or Firm — Servilla Whitney LLC

(57) ABSTRACT

Methods of doping a semiconductor material are disclosed. Some embodiments provide for conformal doping of three dimensional structures. Some embodiments provide for doping with high concentrations of boron for p-type doping.

20 Claims, 3 Drawing Sheets

(56) References Cited

U.S. PATENT DOCUMENTS

2016/0260611 A1    9/2016  Consiglio et al.
2016/0293410 A1*  10/2016  Lei .................... C23C 16/45536
2016/0372351 A1*  12/2016  Singh ................ H01L 21/02568
2017/0110321 A1    4/2017  Cheng et al.
2017/0350004 A1*  12/2017  Kaufman-Osborn .......................
                                                        H01L 21/68785

* cited by examiner

US 11,705,335 B2

CONFORMAL HIGH CONCENTRATION BORON DOPING OF SEMICONDUCTORS

CROSS-REFERENCE TO RELATED APPLICATIONS

This application is a divisional of U.S. patent application Ser. No. 16/444,856, filed Jun. 18, 2019, which claims priority to U.S. Provisional Application No. 62/686,623, filed Jun. 18, 2018, the entire disclosures of which are hereby incorporated by reference herein.

FIELD

Embodiments of the disclosure generally relate to methods for doping semiconductors with boron. Some embodiments provide for high concentration doping to a shallow, controlled depth. Some embodiments provide for doping of three dimensional gate structures.

BACKGROUND

Controlling boron doping is critical for p-type contact applications. Control of the process requires management of layer thicknesses, surface characteristics, thermal budget and etch selectivity. Accordingly, suitable processes must be found and then integrated in the appropriate manner. Additionally, existing methods of boron doping do not provide methods of conformally doping three dimensional structures (e.g., FINFETs). These methods (e.g., implantation) are often limited to line of sight or fail to show sufficient conformality.

Therefore, there is a need for methods of doping semiconductor materials with high concentrations of boron. Specifically, there is a need for methods of doping semiconductor materials conformally.

SUMMARY

One or more embodiments of the disclosure are directed to a method of doping a semiconductor surface. The method comprises providing a substrate comprising a semiconductor material with the semiconductor surface. The native oxide is removed from the semiconductor surface. A conformal buffer layer is deposited on the semiconductor surface. A conformal high concentration boron layer is deposited on the buffer layer. The substrate is annealed to diffuse boron atoms from the high concentration boron layer, through the buffer layer, into the semiconductor material. The high concentration boron layer is removed from the substrate. The buffer layer is removed from the substrate.

Additional embodiments of this disclosure are directed to a method of lowering the resistivity of a semiconductor material. The method comprises providing a substrate comprising a semiconductor material with a semiconductor surface. A native oxide from the semiconductor surface is optionally removed. A conformal buffer layer is deposited on the semiconductor surface. A conformal high concentration boron layer is deposited on the buffer layer. The high concentration boron layer has a boron concentration in a range of about 5 percent to about 40 percent boron on an atomic basis. The substrate is annealed to diffuse boron atoms from the high concentration boron layer, through the buffer layer, and into the semiconductor material to conformally dope the semiconductor material. The semiconductor surface has a concentration of boron greater than or equal to about $2\times10^{20}$ atoms/cm$^3$.

Further embodiments of this disclosure are directed to a method of conformally doping a semiconductor surface. The method comprises providing a substrate comprising a substantially crystalline semiconductor material with a semiconductor surface. The semiconductor material consisting essentially of silicon, germanium or a combination thereof. The semiconductor material forming a three dimensional structure with an overhang. A native oxide is removed from the semiconductor surface. A conformal buffer layer is deposited on the semiconductor surface. The conformal buffer layer comprises silicon oxide. A conformal high concentration boron layer is deposited on the buffer layer. The high concentration boron layer comprises an amorphous boron-doped silicon with a boron concentration in a range of about 5 percent to about 40 percent boron on an atomic basis. The substrate is annealed at a temperature less than or equal to 800° C. to diffuse boron atoms from the high concentration boron layer, through the buffer layer, and into the semiconductor material. The high concentration boron layer is removed from the substrate by a selective etch process which utilizes the buffer layer as an etch stop layer. The buffer layer is removed from the substrate by a selective etch process which utilizes the semiconductor material as an etch stop layer. At least two consecutive steps of the method are performed without a vacuum break. The semiconductor material is doped with boron at a concentration of greater than or equal to about $2\times10^{20}$ atoms/cm$^3$ at the semiconductor surface, and doping the semiconductor surface lowers the resistivity of the semiconductor material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
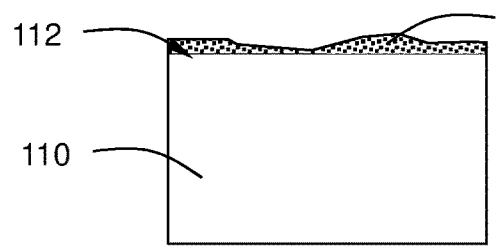
FIG. 1 depicts a cross sectional view of a substrate during processing in accordance with one or more embodiment of the present disclosure.

Before describing several exemplary embodiments of the disclosure, it is to be understood that the disclosure is not limited to the details of construction or process routines set forth in the following description. The disclosure is capable of other embodiments and of being practiced or being carried out in various ways.

A "substrate", "substrate surface", or the like, as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

Embodiments of the disclosure provide methods for doping a semiconductor material with high concentrations of boron. Some embodiments utilize an amorphous buffer layer and a conformal layer with a high concentration of boron to conformally dope the semiconductor material. Some embodiments dope three dimensional structures.

Some embodiments of the disclosure advantageously provide methods for doping high concentrations of boron into semiconductor materials. Some embodiments of the disclosure advantageously provide for the conformal doping of semiconductor materials. Some embodiments of the disclosure advantageously provide methods which are able to be performed without a vacuum break between processes.

Some embodiments of the disclosure relate to a method of doping a semiconductor surface. The method generally begins with a substrate being provided and placed into a processing chamber. The substrate comprises a semiconductor material with a semiconductor surface. The substrate surface may have one or more features formed thereon, one or more layers formed thereon, and combinations thereof. The substrate (or substrate surface) may be pretreated prior to the start of the method, for example, by polishing, etching, reduction, oxidation, halogenation, hydroxylation, annealing, baking, or the like. In some embodiments, the substrate comprises a three dimensional structure. The three dimensional structure may take any suitable form including, but not limited to, fins, stacks, or columns. In some embodiments, the three dimensional structure comprises an overhang. The overhang makes a conformal doping method more difficult by blocking line-of sight to portions the structure's surface.

In some embodiments, the semiconductor material comprises or consists essentially of Si, Ge, SiGe or a stack of these materials. As used in this regard, "consists essentially of" mean the stated material is greater than or equal to about 98%, greater than or equal to about 99%, greater than or equal to about 99.5%, or greater than or equal to about 99.9% of the stated element(s) on an atomic basis (excluding hydrogen).

In some embodiments, the semiconductor material is substantially crystalline. As used in this regard, "substantially crystalline" means that the semiconductor material has a volume which is greater than or equal to about 90%, greater than or equal to about 95%, greater than or equal to about 98%, greater than or equal to about 99%, or greater than or equal to about 99.5% crystalline by volume.

Figure 2:
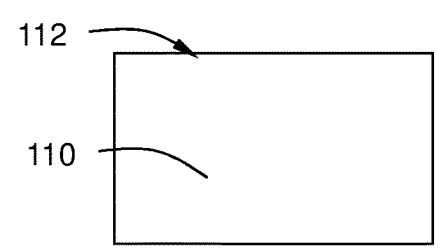
FIG. 2 depicts a cross sectional view of a substrate during processing in accordance with one or more embodiment of the present disclosure.

FIG. 1 shows a semiconductor material 110 with a semiconductor surface 112. As shown, in some embodiments, the semiconductor surface 112 has a native oxide 120 thereon. In some embodiments, the method continues by removing any native oxide 120 from the semiconductor surface 112. In some embodiments, the native oxide is removed by SRP. FIG. 2 shows a semiconductor material 110 with a semiconductor surface 112. As shown in FIG. 2, there is no native oxide on the semiconductor surface 112.

Figure 3:
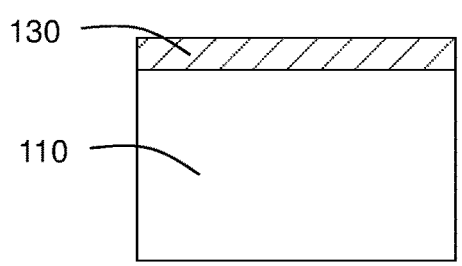
FIG. 3 depicts a cross sectional view of a substrate during processing in accordance with one or more embodiment of the present disclosure.

In some embodiments, the method continues by depositing a conformal buffer layer 130 on the semiconductor surface 112. FIG. 3 shows a semiconductor material 110 with a conformal buffer layer 130 deposited on the semiconductor surface 112.

In some embodiments, the conformal buffer layer 130 comprises silicon oxide. In some embodiments, the conformal buffer layer 130 is formed by depositing amorphous silicon which is subsequently oxidized. In some embodiments, the conformal buffer layer is oxidized by direct plasma oxidation, rapid thermal oxidation, remote plasma oxidation, or oxygen radical oxidation. In some embodiments, the conformal buffer layer 130 is deposited by atomic layer deposition of $SiO_2$.

Alternatively, in some embodiments, the conformal buffer layer 130 is formed by oxidizing the semiconductor material 110 directly. However, the inventors have found that the varying oxidation rates of Si, Ge, and/or SiGe semiconductor materials can make forming a conformal oxide layer difficult by direct oxidation.

Figure 4:
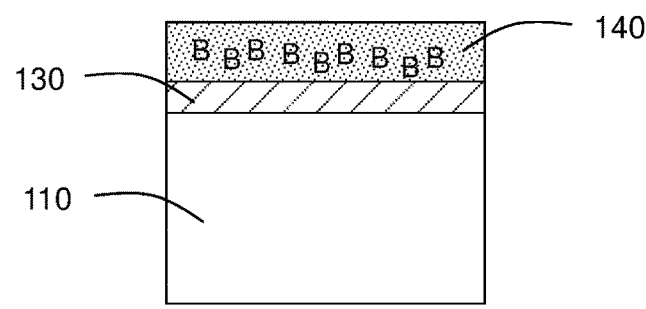
FIG. 4 depicts a cross sectional view of a substrate during processing in accordance with one or more embodiment of the present disclosure.

The method continues by depositing a conformal high boron concentration layer 140 on the buffer layer 130. FIG. 4 shows a semiconductor material 110 with a conformal high boron concentration layer 140 deposited on the conformal buffer layer 130.

In some embodiments, the high boron concentration layer 140 comprises an amorphous boron-doped silicon layer. In some embodiments, the high boron concentration layer 140 has a boron concentration in a range of about 5 percent to about 40 percent boron on an atomic basis. In some embodiments, the high boron concentration layer 140 has a boron concentration of greater than or equal to about 5 atomic percent, greater than or equal to about 8 atomic percent, greater than or equal to about 10 atomic percent, greater than or equal to about 15 atomic percent, or greater than or equal to about 20 atomic percent.

The method continues by annealing the substrate to drive boron atoms from the high concentration boron layer, through the buffer layer, into the semiconductor material.

Figure 5:
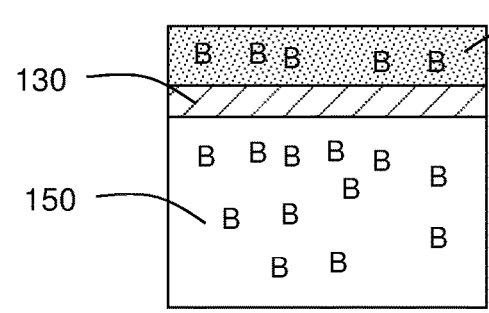
FIG. 5 depicts a cross sectional view of a substrate during processing in accordance with one or more embodiment of the present disclosure.

FIG. 5 shows a doped semiconductor material 150 with a conformal high boron concentration layer 140 on a conformal buffer layer 130.

The anneal process may be performed by any suitable process depending on the desired quantity of boron penetration. In some embodiments, the substrate is annealed at a temperature less than or equal to about 800° C. In some embodiments, the substrate is annealed at a temperature less than or equal to about 1000° C. In some embodiments, the substrate is annealed at a temperature greater than or equal to about 1000° C.

Figure 6:
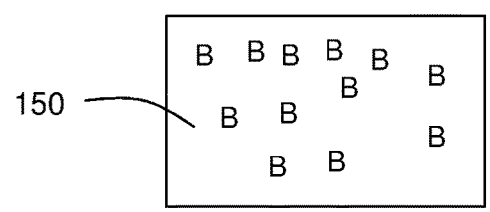
FIG. 6 depicts a cross sectional view of a substrate during processing in accordance with one or more embodiment of the present disclosure.

After the boron has been doped into the substrate, the high boron concentration layer and the buffer layer can be removed. FIG. 6 shows a doped semiconductor material 150 without a conformal high boron concentration layer 140 or a conformal buffer layer 130.

In some embodiments, the layers are removed sequentially by separate selective etch/removal processes. In some embodiments, the high concentration boron layer is removed by a selective etch process which utilizes the buffer layer as an etch stop layer. In some embodiments, the buffer layer is removed by a selective etch process which utilizes the semiconductor material as an etch stop layer.

After removal of the layers, the method ends. The remaining semiconductor material has been doped with boron at a concentration of greater than or equal to about $2 \times 10^{20}$ atoms/cm$^3$ at the semiconductor surface. The inventors have also found that this doping is conformal. As used in this regard, doping is conformal when the depth of the dopant is similar regardless of surface orientation or position on a substrate surface. In some embodiments, the inventors have found that doping the semiconductor surface lowers the resistivity of the semiconductor material.

Figure 7:
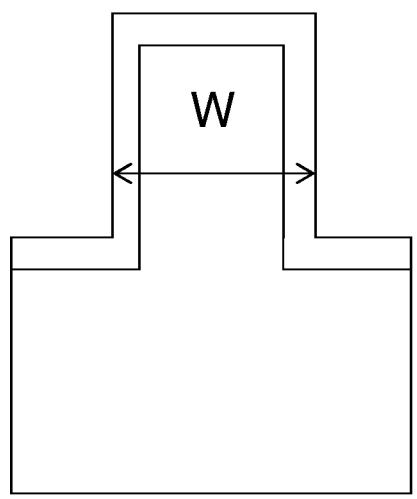
FIG. 7 depicts a cross sectional view of a substrate with a fin structure during processing in accordance with one or more embodiment of the present disclosure.
Figure 8:
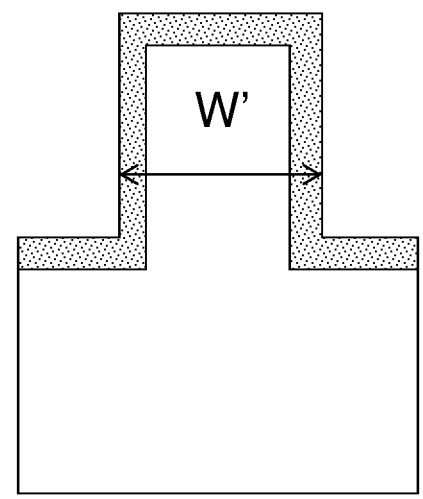
FIG. 8 depicts a cross sectional view of a substrate with a fin structure after processing in accordance with one or more embodiment of the present disclosure.

In some embodiments, the semiconductor material comprises a fin structure. As shown in FIG. 7, in some embodiments, the fin structure has a width W before doping with boron atoms. After performing the processing method of one or more embodiments, the fin structure may be doped with boron atoms. As shown in FIG. 8, in some embodiments, the fin structure has an width W' after doping with boron atoms. Stated differently, in some embodiments, the processing methods disclosed herein result in substantially no fin narrowing.

As used in this regard, a fin width which is "substantially the same" is varied by less than or equal to about 5%, less than or equal to about 2%, less than or equal to about 1%, or less than or equal to about 0.5%. Similarly, a processing method which results in substantially no fin narrowing provides a fin width W' which is greater than or equal to about 95%, greater than or equal to about 98%, greater than or equal to about 99%, or greater than or equal to about 99.5% of the initial fin width W.

In some embodiments, at least two consecutive steps of the method are performed without a vacuum break. The absence of a vacuum break provides for greater substrate throughput and a lower cost of operation.

Figure 9:
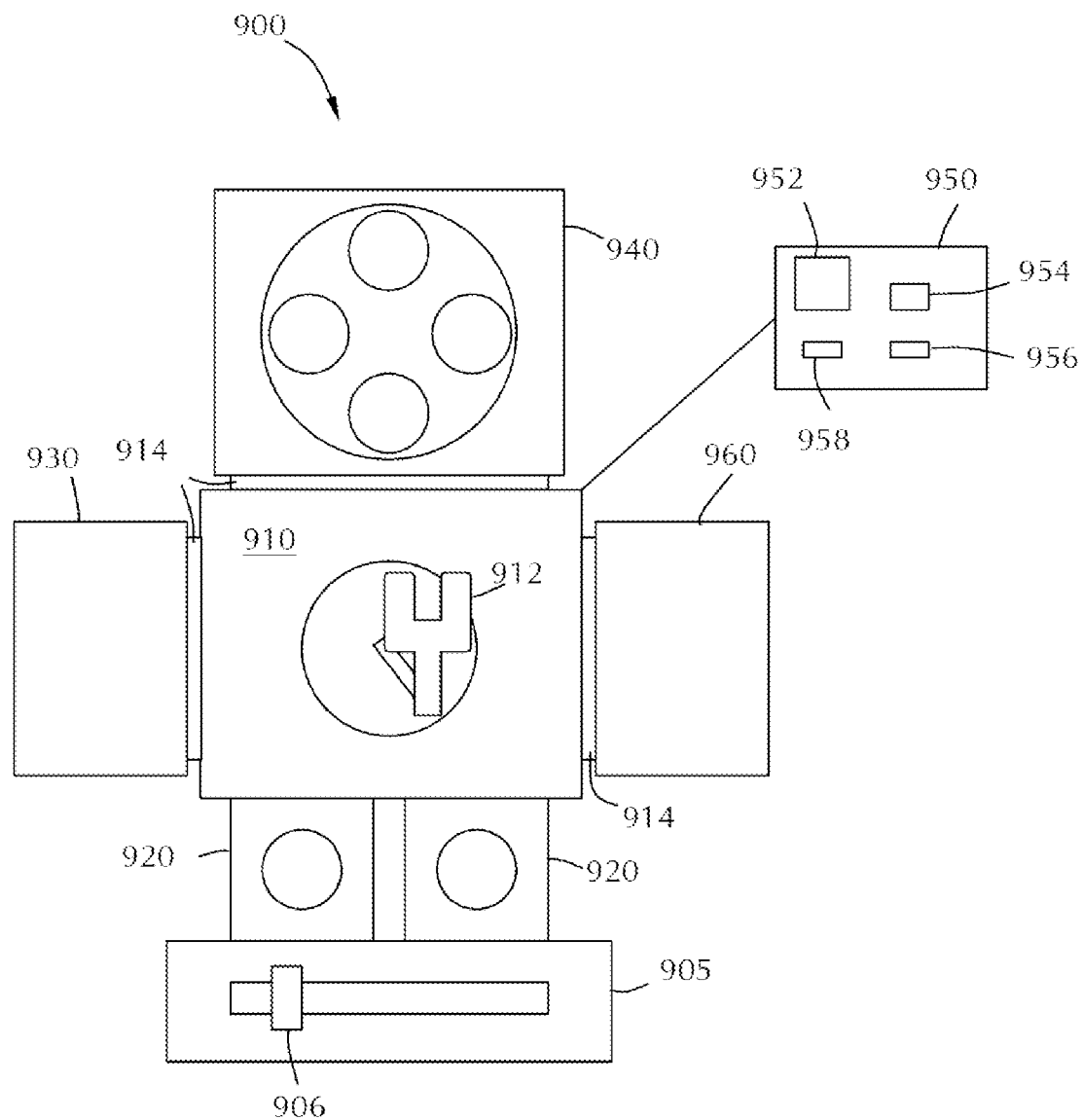
FIG. 9 depicts a processing system in accordance with one or more embodiment of the present disclosure.

With reference to FIG. 9, additional embodiments of the disclosure are directed to a processing system 900 for executing the methods described herein. FIG. 9 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers connected to the central transfer station 910.

At least one pre-clean/buffer chamber 920 is connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, any native oxide may be removed from a substrate within the pre-clean/buffer chamber 920. In some embodiments, there are two pre-clean/buffer chambers 920 connected to the central transfer station 910.

In the embodiment shown in FIG. 9, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as a deposition chamber and may be in fluid communication with one or more reactive gas sources to provide one or more flows of reactive gases to the first processing chamber 930. In some embodiments, the first processing chamber 930 may be configured to deposit a conformal buffer layer. The substrate can be moved to and from the processing chamber 930 by the robot 912 passing through isolation valve 914.

Processing chamber 940 can also be connected to the central transfer station 910. In some embodiments, processing chamber 940 comprises a deposition chamber and is fluid communication with one or more reactive gas sources to provide flows of reactive gas to the processing chamber 940. In some embodiments, the processing chamber 940 may be configured to deposit a high concentration boron layer. The substrate can be moved to and from the processing chamber 940 by robot 912 passing through isolation valve 914.

Additional processing chambers, not shown, can also be connected to the central transfer station 910. In some embodiments, the additional processing chambers are the same type of processing chamber 940 configured to perform the same process as processing chamber 940. This arrangement might be useful where the process occurring in processing chamber 940 takes much longer than the process in processing chamber 930.

In some embodiments, processing chamber 960 is connected to the central transfer station 910 and is configured to act as an anneal chamber.

In some embodiments, one or more processes described herein occur in the same processing chamber as another process described herein. In embodiments of this sort, the processing chamber 930 can be configured to perform the deposition of the conformal buffer layer and the high concentration boron layer.

In some embodiments, each of the processing chambers 930, 940 and 960 are configured to perform different portions of the processing method. For example, processing chamber 930 may be configured to perform deposition processes, processing chamber 940 may be configured to perform anneal processes and processing chamber 960 may be configured to perform etch processes. The skilled artisan will recognize that the number and arrangement of individual processing chamber on the tool can be varied and that the embodiment illustrated in FIG. 9 is merely representative of one possible configuration.

In some embodiments, the processing system 900 includes one or more metrology stations. For example metrology stations can be located within pre-clean/buffer chamber 920, within the central transfer station 910 or within any of the individual processing chambers 930, 940, 960. The metrology station can be any position within the system 900 that allows for measurement of the substrate without exposure to an oxidizing environment.

At least one controller 950 is coupled to one or more of the central transfer station 910, the pre-clean/buffer chamber 920, processing chambers 930, 940, or 960. In some embodiments, there are more than one controller 950 connected to the individual chambers or stations and a primary control processor is coupled to each of the separate processors to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 950 has one or more configurations to execute individual processes or sub-processes to perform methods disclosed herein. The controller 950 can be connected to and configured to operate intermediate components to perform the functions of the methods. For example, the controller 950 can be connected to and configured to control one or more of gas valves, actuators, motors, slit valves, vacuum controls, etc.

The controller 950 of some embodiments has one or more configurations selected from: a configuration to move a substrate on the robot between the plurality of processing chambers and metrology station; a configuration to move a substrate on the robot between the plurality of processing chambers; a configuration to load and/or unload substrates from the system; a configuration to remove a native oxide from the substrate in a pre-clean chamber; a configuration to form a conformal buffer layer on the substrate; a configuration to deposit a high concentration boron layer; a configuration to drive boron from the high concentration boron layer through the conformal buffer layer to the substrate; a configuration to remove the high concentration boron layer; or a configuration to remove the conformal buffer layer.

The methods described herein can be executed by a non-transitory computer readable storage medium including instructions, that, when executed by a controller or processing unit, of a processing chamber, cause the processing system to perform the disclosed methods. In some embodiments, the non-transitory computer-readable storage medium includes instructions, that, when executed by a processing unit (e.g., controller) of the processing chamber cause the processing chamber to perform the operations of: forming a conformal buffer layer on a semiconductor surface of a semiconductor material; forming a high concentration boron layer on the conformal buffer layer; annealing the high concentration boron layer to drive boron atoms through the conformal buffer layer into the semiconductor material; removing the high concentration boron layer; and removing the conformal buffer layer. In some embodiments, the non-transitory computer-readable storage medium includes instructions, that, when executed by a processing unit of the processing chamber cause the processing chamber to remove a native oxide from the semiconductor surface Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing system comprising:
   a central transfer station having a robot therein;
   a plurality of process chambers connected to the central transfer station, the plurality of process chambers comprising one or more of a pre-clean chamber, a deposition chamber, an annealing chamber or an etch chamber, the robot configured to move a substrate between the plurality of process chambers; and a controller having a configuration to move a substrate on the robot between the plurality of processing chambers; a configuration to load and/or unload substrates from the system; a configuration to form a conformal buffer layer on a semiconductor surface of a semiconductor material on the substrate; a configuration to deposit a conformal amorphous boron-doped silicon layer on the buffer layer; and a configuration to anneal the substrate to diffuse boron atoms from the boron-doped silicon layer through the buffer layer to the semiconductor material, wherein the boron-doped silicon layer has a boron concentration in a range of about 5 percent to about 40 percent boron on an atomic basis.

2. The processing system of claim 1, wherein the controller further comprises a configuration to remove a native oxide from the semiconductor surface in a pre-clean chamber.

3. The processing system of claim 1, wherein the controller further comprises a configuration to remove the conformal amorphous boron-doped silicon layer.

4. The processing system of claim 3, wherein the controller further comprises a configuration to remove the conformal buffer layer.

5. The processing system of claim 4, wherein the controller is configured to remove the conformal buffer layer by a selective etch process which utilizes the semiconductor material as an etch stop layer.

6. The processing system of claim 1, wherein the controller is configured to remove the boron-doped silicon layer by a selective etch process which utilizes the buffer layer as an etch stop layer.

7. The processing system of claim 1, wherein the substrate is maintained under vacuum during processing in two or more process chambers.

8. The processing system of claim 1, wherein the semiconductor material comprises a three dimensional structure.

9. The processing system of claim 8, wherein the semiconductor material comprises a fin structure having a width before doping with boron atoms that is substantially the same as a width after doping with boron atoms.

10. The processing system of claim 1, wherein the semiconductor material is substantially crystalline.

11. The processing system of claim 1, wherein the semiconductor material consists essentially of silicon, germanium or a combination thereof.

12. The processing system of claim 1, wherein the buffer layer consists essentially of silicon oxide.

13. The processing system of claim 1, wherein the boron-doped silicon layer has a thickness in a range of about 50 Å to about 100 Å.

14. The processing system of claim 1, wherein annealing is performed at a temperature less than or equal to about 1000° C.

15. The processing system of claim 1, wherein the semiconductor material is doped with boron at a concentration of greater than or equal to about $2 \times 10^{20}$ atoms/cm$^3$ at the semiconductor surface.

16. The processing system of claim 1, wherein the semiconductor material is doped conformally.

17. A non-transitory computer readable medium including instructions, that, when executed by a controller of a processing chamber, cause the processing chamber to perform operations of:

depositing a conformal buffer layer on a semiconductor surface of a semiconductor material;

depositing a conformal amorphous boron-doped silicon layer on the buffer layer, the boron-doped silicon layer having a boron concentration in a range of about 5 percent to about 40 percent boron on an atomic basis; and annealing the semiconductor material to diffuse boron atoms from the boron-doped silicon layer, through the buffer layer, to the semiconductor material.

18. The non-transitory computer readable medium of claim 17, wherein the instructions, when executed by a controller of a processing chamber, cause the processing chamber to remove a native oxide from the semiconductor surface before depositing the conformal buffer layer.

19. The non-transitory computer readable medium of claim 17, wherein the instructions, when executed by a controller of a processing chamber, cause the processing chamber to remove the boron-doped silicon layer from the buffer layer.

20. The non-transitory computer readable medium of claim 19, wherein the instructions, when executed by a controller of a processing chamber, cause the processing chamber to remove the buffer layer from the semiconductor material.

* * * * *